United States Patent
Chen

(10) Patent No.: US 10,230,344 B2
(45) Date of Patent: Mar. 12, 2019

(54) ADJUSTABLE GAIN POWER AMPLIFIER, GAIN ADJUSTMENT METHOD AND MOBILE TERMINAL

(71) Applicant: SHANGHAI VANCHIP TECHNOLOGIES CO., LTD., Shanghai (CN)

(72) Inventor: Ji Chen, Shanghai (CN)

(73) Assignee: SHANGHAI VANCHIP TECHNOLOGIES CO., LTD., Shanghai (CN)

( * ) Notice: Subject to any disclaimer, the term of this patent is extended or adjusted under 35 U.S.C. 154(b) by 0 days.

(21) Appl. No.: 15/551,043

(22) PCT Filed: Jan. 12, 2016

(86) PCT No.: PCT/CN2016/070730
§ 371 (c)(1),
(2) Date: Aug. 15, 2017

(87) PCT Pub. No.: WO2016/127753
PCT Pub. Date: Aug. 18, 2016

(65) Prior Publication Data
US 2018/0034428 A1 Feb. 1, 2018

(30) Foreign Application Priority Data
Feb. 15, 2015 (CN) .......................... 2015 1 0081063 9

(51) Int. Cl.
*H03F 3/191* (2006.01)
*H03G 3/20* (2006.01)
(Continued)

(52) U.S. Cl.
CPC ................. *H03G 3/20* (2013.01); *H03F 1/02* (2013.01); *H03F 1/0261* (2013.01);
(Continued)

(58) Field of Classification Search
CPC .................................. H03F 3/191; H03G 3/30
(Continued)

(56) References Cited

U.S. PATENT DOCUMENTS 8,354,888 B2 * 1/2013 Matsuzuka ........... H03F 1/0261
330/285

FOREIGN PATENT DOCUMENTS

| CN | 101364791 A | 2/2009 |
|---|---|---|
| CN | 201438689 U | 4/2010 |

(Continued)

*Primary Examiner* — Steven J Mottola
(74) *Attorney, Agent, or Firm* — Mark M. Friedman

(57) ABSTRACT

An adjustable gain power amplifier, a gain adjustment method and a mobile terminal are disclosed. The adjustable gain power amplifier comprises an input matching circuit, a gain adjustment circuit, a biasing circuit, a main amplification circuit, and an output matching circuit; the input matching circuit is connected between an input end and the gain adjustment circuit; the gain adjustment circuit is connected between the input matching circuit and the input end of the main amplification circuit; the output end of the main amplification circuit is connected to the output matching circuit, a positive power source end thereof is connected to a power supply source, a negative power source end thereof is connected to the biasing circuit; the biasing circuit provides different biasing voltages for the main amplification circuit; and the gain adjustment circuit and the biasing circuit are respectively connected to a gain adjustment control voltage (Vctrl).

8 Claims, 2 Drawing Sheets

(51) Int. Cl.
*H03F 1/02* (2006.01)
*H03F 1/56* (2006.01)
*H03F 3/19* (2006.01)
*H03F 3/21* (2006.01)
*H03F 3/72* (2006.01)
*H03G 1/00* (2006.01)
H03G 3/30 (2006.01)

(52) U.S. Cl.
CPC ............ *H03F 1/0277* (2013.01); *H03F 1/56* (2013.01); *H03F 3/19* (2013.01); *H03F 3/21* (2013.01); *H03F 3/72* (2013.01); *H03G 1/0088* (2013.01); *H03F 2200/211* (2013.01); *H03F 2200/222* (2013.01); *H03F 2200/387* (2013.01); *H03F 2200/451* (2013.01); *H03G 3/3042* (2013.01)

(58) Field of Classification Search
USPC ........................................ 330/285, 302, 305
See application file for complete search history.

(56) References Cited

FOREIGN PATENT DOCUMENTS

| | | | |
|---|---|---|---|
| CN | 101888210 | A | 11/2010 |
| CN | 203261299 | U | 10/2013 |
| CN | 104917475 | A | 9/2015 |
| JP | 2007235524 | A | 9/2007 |
| JP | 5342419 | B2 | 11/2013 |

\* cited by examiner

ADJUSTABLE GAIN POWER AMPLIFIER, GAIN ADJUSTMENT METHOD AND MOBILE TERMINAL

BACKGROUND

Technical Field

The present invention relates to an adjustable gain power amplifier, a gain adjustment method applied to the adjustable gain power amplifier, and a mobile terminal including the adjustable gain power amplifier, pertaining to the technical field of power amplifiers.

Related Art

With the constant development of wireless communication technologies, various portable wireless communication devices have been widely applied. A power amplifier is an indispensable circuit module in a wireless communication device, and is mainly responsible for amplifying a modulated radio frequency signal to a particular power value and transmitting the amplified signal by using an antenna, so that a base station nearby receives the amplified signal. An operating band of a wireless terminal covers various mobile communication standards such as Wideband Code Division Multiple Access (WCDMA) and Time Division-Synchronous Code Division Multiple Access (TD-SCDMA). Regardless of which communication standard is used, a mobile terminal usually needs to adjust a transmit power of a power amplifier according to a distance between the mobile terminal and a base station.

When a wireless communication terminal is far away from a receiving base station, a power amplifier needs to transmit a signal by using a relatively high transmit power, so that the signal still has sufficient strength and can be received and recognized by the base station when arriving at the base station. In contrast, when the wireless communication terminal is near the base station, the power amplifier only needs to transmit the signal by using a relatively low power. Therefore, it is required during design to enable a radio frequency power amplifier to switch between several power (gain) modes. A common power amplifier includes two power modes, namely, a high power mode and a low power mode. A relatively high gain is required in the high power mode and a relatively low gain is required in the low power mode, so that the power amplifier realizes an output of a large dynamic range.

FIG. 1 is a circuit diagram of a common power amplifier in the prior art. The circuit includes two independent amplification paths: a high power mode amplification path and a low power mode amplification path. The two paths share one input and one output. When the power amplifier works in the high power mode, a switch 101 and a switch 102 are closed, and a switch 103 and a switch 104 are open. Moreover, a biasing circuit 105 provides a biasing voltage to an amplification circuit 106, and a biasing voltage of an amplification circuit 107 is cut off. In contrast, when the power amplifier works in the low power mode, the switch 103 and the switch 104 are closed, and the switch 101 and the switch 102 are open. Moreover, the biasing circuit 105 provides a biasing voltage to the amplification circuit 107, and a biasing voltage of the amplification circuit 106 is cut off. For another example, Chinese Utility Model Patent No. ZL 200920055959.X discloses a high and low power combining circuit for a radio frequency power amplifier. The circuit also uses two power modes. Three switches in the circuit are controlled by using a voltage to perform power switching on a radio frequency signal, so as to control a cut-off of an amplifier and switch between a high power and a low power.

However, in all the foregoing power amplifiers, the high power mode and the low power mode are independently designed. Although the performance can be optimized, the overall circuit design is relatively complex, requiring excessive resources and increasing production costs. More importantly, limited by the gallium arsenide (GaAs) process, it is difficult to integrate switches required on a radio frequency path.

SUMMARY

For disadvantages in the prior art, a key technical problem to be resolved in the present invention is to provide an adjustable gain power amplifier.

Another technical problem to be resolved in the present invention is to provide a gain adjustment method for the adjustable gain power amplifier.

Still another technical problem to be resolved in the present invention is to provide a mobile terminal that includes the adjustable gain power amplifier.

To achieve the foregoing inventive objective, the following technical solutions are used in the present invention:

According to a first aspect of embodiments of the present invention, an adjustable gain power amplifier is provided, including an input matching circuit, a gain adjustment circuit, a biasing circuit, a main amplification circuit, and an output matching circuit, where the input matching circuit is connected between an input end and the gain adjustment circuit;

the gain adjustment circuit is connected between the input matching circuit and an input end of the main amplification circuit;

an output end of the main amplification circuit is connected to the output matching circuit; a positive power source end thereof is connected to a power supply source and a negative power source end thereof is connected to the biasing circuit;

the biasing circuit provides different biasing voltages for the main amplification circuit; and the gain adjustment circuit and the biasing circuit are respectively connected to a gain adjustment control voltage.

Preferably, the gain adjustment circuit includes at least one stage of gain adjustment branch;

the gain adjustment branch includes a capacitor, resistors, and a diode, where one end of the capacitor is connected between the input matching circuit and the input end of the main amplification circuit; another end of the capacitor is sequentially connected in series to a second resistor and an anode of the diode; a cathode of the diode is grounded; a connecting point between the second resistor and the anode of the diode is connected to the gain adjustment control voltage by using a first resistor.

Preferably, when the gain adjustment circuit includes multiple stages of gain adjustment branches, the gain adjustment branches are connected in parallel; the output end is connected between the input matching circuit and the main amplification circuit.

Preferably, the gain adjustment control voltage is independently configured for each of the gain adjustment branches.

Preferably, the gain adjustment control voltage corresponding to the multiple stages of gain adjustment branches is configured for the biasing circuit.

Preferably, the diode is replaced with a triode or a field effect transistor.

According to a second aspect of the embodiments of the present invention, a gain adjustment method for the adjustable gain power amplifier is provided, including the following steps:

when the power amplifier works in a low frequency mode, the gain adjustment control voltage inputs a high level; the biasing circuit provides a low biasing voltage to the main amplification circuit; and the gain adjustment circuit is on and an input signal of the power amplifier is greatly attenuated; when the power amplifier works in a high frequency mode, the gain adjustment control voltage inputs a low level; the biasing circuit provides a high biasing voltage to the main amplification circuit; and the gain adjustment circuit is approximately off and the input signal is slightly attenuated.

Preferably, the gain adjustment circuit needs to satisfy:

$$R_1 \gg r_d, R_1 \gg R_2, \frac{1}{j\omega C_1} \ll R_2,$$

$$\text{let } Z_{on} \approx R_2 + r_d = R_2 + \frac{V_T}{I_{CQ}}, Z_{off} \approx R_1,$$

where $R_1$ is a resistance of the first resistor; $R_2$ is a resistance of the second resistor; $C_1$ is a capacitive reactance of the capacitor; $r_d$ is a small signal alternating-current impedance of the diode; $\omega$ is a working frequency of the gain adjustment circuit; $Z_{on}$ is a small signal impedance of the gain adjustment circuit in the low frequency mode; $Z_{off}$ is a small signal impedance of the gain adjustment circuit in the high frequency mode; $V_T$ is a thermal voltage.

Preferably, when the power amplifier works in the low frequency mode, a needed low gain is obtained by adjusting the first resistor and a quiescent current of the diode.

According to a third aspect of the embodiments of the present invention, a mobile terminal is provided, including the adjustable gain power amplifier.

The power amplifier provided in the present invention implements switching of multiple power modes only by using an independent radio frequency amplification path. The power amplifier is no longer merely limited to an adjustment of the high power mode and the low power mode, so that gain adjustment requirements in a multi-power mode can be satisfied, thus realizing an output of a larger dynamic range. The circuit of the power amplifier has a simple structure and is convenient to integrate. A power switching may be implemented by using the gain adjustment control voltage without a need of a power switching switch, and effects are obvious in the gain adjustment.

DETAILED DESCRIPTION

The following describes a technical content of the present invention in detail with reference to accompanying drawings and embodiments.

Figure 1:
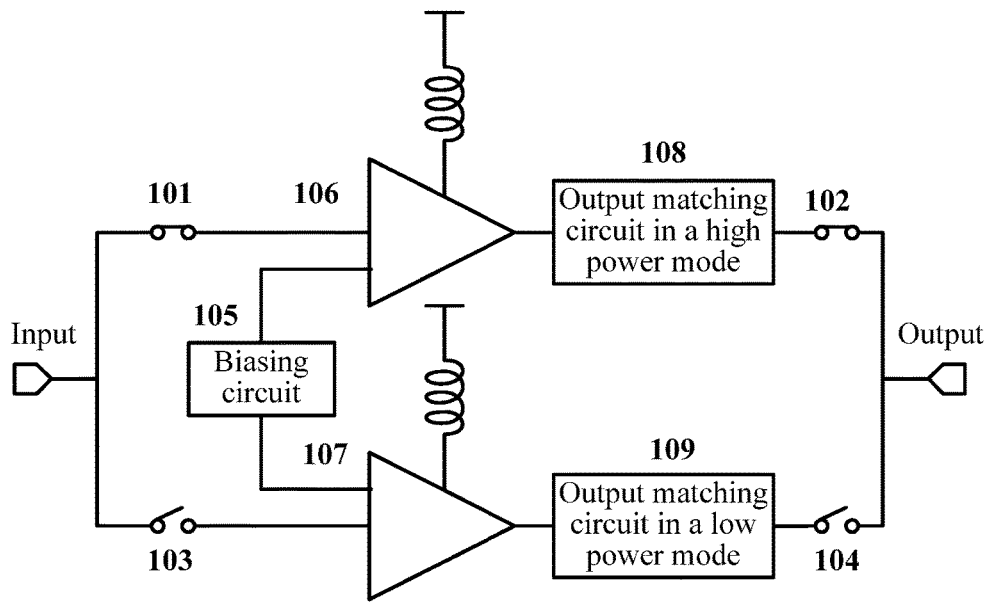
FIG. 1 is a circuit diagram of a common power amplifier in the prior art.
Figure 2:
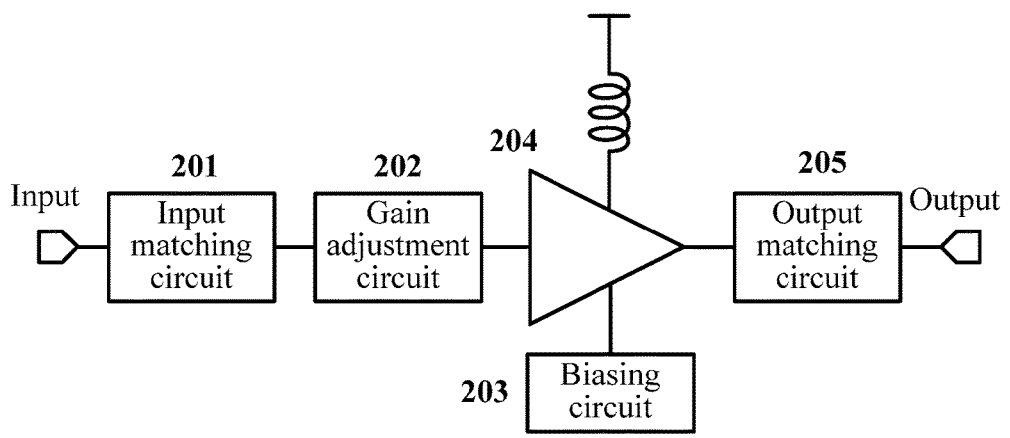
FIG. 2 is a whole schematic structural diagram of an adjustable gain power amplifier according to the present invention.

A power amplifier provided in the present invention implements switching of multiple power modes by using an independent radio frequency amplification path and by coordinating a gain adjustment circuit 202 with a biasing circuit 203. Referring to FIG. 2, a specific circuit structure of the power amplifier includes an input matching circuit 201, the gain adjustment circuit 202, the biasing circuit 203, a main amplification circuit 204, and an output matching circuit 205. The input matching circuit 201 is connected between an input end and the gain adjustment circuit 202, and is configured to perform matching between impedances among elements, so as to avoid a power loss of a radio frequency signal in a transmitting process. A positive power source end of the main amplification circuit 204 is connected to a power supply source by using a resistor, and a negative power source end of the main amplification circuit 204 is connected to the biasing circuit 203, and an output end is connected to the output matching circuit 205. Moreover, a power mode selecting signal Vctrl needs to control the gain adjustment circuit 202 and the biasing circuit 203 at the same time.

During switching between different power modes, in addition to that the biasing circuit 203 provides different biasing voltages to the main amplification circuit 204, the gain adjustment circuit 202 is added between the input matching circuit 201 and the main amplification circuit 204, so as to further optimize a gain.

An operating principle of the power amplifier provided in the present invention is as follows: when the power amplifier needs to output a relatively high power, the biasing circuit 203 provides a relatively high biasing voltage; and while a linearity of an output signal of the power amplifier is ensured, the gain adjustment circuit 202 is approximately off so that a signal in a radio frequency path is slightly attenuated. Therefore, one relatively high gain of the power amplifier is achieved. When the power amplifier needs to output a relatively low power, the biasing circuit 203 provides a relatively low biasing voltage on the premise that the linearity of the output signal is ensured. A relatively low biasing voltage may improve efficiency of the power amplifier to prolong a usage time. Moreover, the gain of the power amplifier gradually decreases as a quiescent current decreases, so as to reduce a low limit of a dynamic range of an output power. The added gain adjustment circuit 202 is on at the same time to control the signal in the radio frequency path to be greatly attenuated, so that the gain of the power amplifier is further reduced.

Embodiment 1

Figure 3:
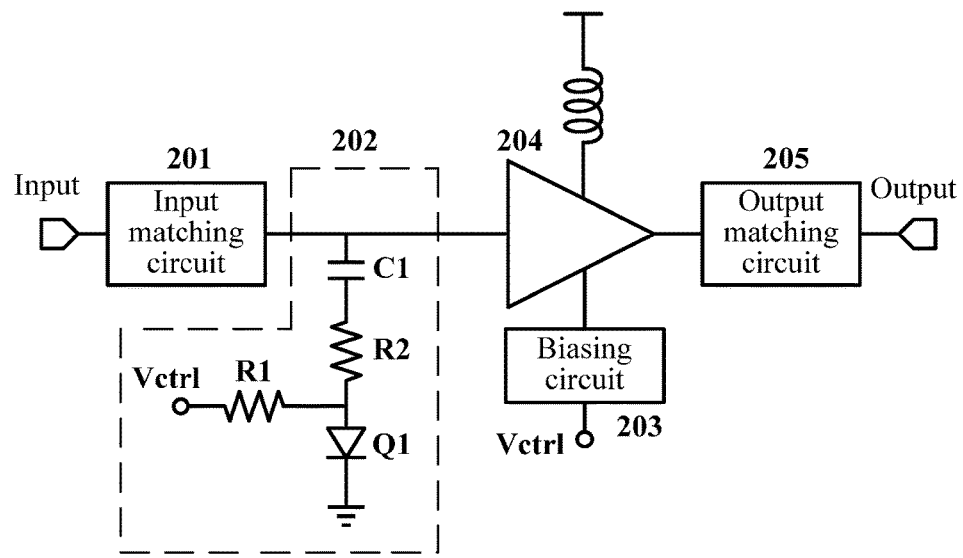
FIG. 3 is a schematic circuit diagram of a gain adjustment circuit according to Embodiment 1 of the present invention.

The embodiment has improved the gain adjustment circuit, and for a diagram of a specific circuit principle, refer to FIG. 3. The entire gain adjustment circuit 202 includes a resistor R1, a resistor R2, a capacitor C1, and a diode Q1. One end of the capacitor C1 is connected to a signal path between an input matching circuit 201 and a main amplification circuit 204. Another end of the capacitor C1 is sequentially connected in series to the resistor R2 and an anode of the diode Q1. A cathode of the diode Q1 is grounded. One end of the resistor R1 is connected to a connecting point between the resistor R2 and the diode Q1. Another end of the resistor R1 is connected to a gain adjustment control voltage Vctrl. The capacitor C1 mainly plays a role of DC blocking, so that the gain adjustment circuit 202 may independently establish a direct current operation point without affecting a direct current operation of the main amplification circuit 204. The resistor R1 participates in the establishment of the direct current operation point of the diode and adjusts an operating current of the diode, so as to adjust an alternating-current impedance of the diode. The resistor R2 provides an extra factor to flexibly adjust an impedance of the gain adjustment circuit. As a power mode selecting signal, the gain adjustment control voltage Vctrl controls the gain adjustment circuit 202 and the biasing circuit 203 at the same time. Compared with a power switching mode that is controlled by using a switch, power mode selecting of the power amplifier is controlled by using the Vctrl in the present invention, so that the circuit is simpler and is convenient to integrate.

As is known to all, the diode has a switching characteristic. When a forward voltage-drop that is applied on the diode is higher than an. On voltage Von of the diode, the diode opens; in contrast, when the forward voltage-drop that is applied on the diode is lower than the On voltage Von or a reverse biasing voltage is applied, the diode is cut off. The gain adjustment circuit 202 of the embodiment implements the power switching and control just by using the switching characteristic of the diode. Certainly, the diode may be replaced with another element that has a switching characteristic, such as a triode or a field effect transistor. Only the diode is taken as an example below to introduce a specific method for implementing, by the power amplifier, gain adjustment in different power modes.

When the power amplifier needs to work in the high power mode, the Vctrl inputs a low level; the biasing circuit 203 provides a high biasing voltage; the diode Q1 in the gain adjustment circuit 202 is cut off, a greatly high impedance is presented, and few radio frequency input signals are shunted to the ground from this branch. The gain adjustment circuit 202 is approximately off so that the signal in the radio frequency path is slightly attenuated, so as to ensure that the power amplifier outputs a relatively high gain. When the power amplifier works in the low power mode, the Vctrl inputs a high level; the biasing circuit 203 provides a relatively low biasing voltage; the diode Q1 in the gain adjustment circuit 202 opens. In an operating band of the power amplifier, the gain adjustment circuit 202 is on and an appropriate alternating-current impedance is presented. Some input signals are shunted from the branch composed of the capacitor C1, the resistor R2, and the diode Q1, so that the signal in the radio frequency path is greatly attenuated, so as to ensure that the power amplifier has a relatively low gain.

By using a specific calculation process, how to select elements to optimize an adjustment effect of the gain adjustment circuit 202 is introduced below. The diode is a non-linear device, and analysis and calculation for a non-linear circuit are complex. Normally, to simply the circuit analysis, an equivalent circuit composed of linear elements may be used to simulate the diode. Obviously, the equivalent circuit is only similar to the diode under certain conditions.

When an appropriate voltage v is applied to two ends of the diode, a volt-ampere characteristic of the diode may be similarly described by using the following formula:

$$i = I_S\left(e^{\frac{v}{V_T}} - 1\right) \quad (1)$$

$I_S$ is a reverse saturation current that is related to doping and an area of a p-n junction, and is unrelated to magnitude of a reverse voltage. $V_T$ is a thermal voltage, and its value may be represented as:

$$V_T = kT/q \quad (2)$$

T is a thermodynamic temperature, k is the Boltzmann constant, and q is a quantity of electric charges. At the room temperature, $V_T \approx 26$ mV.

A small signal alternating-current impedance $r_d$ of the diode may be obtained by simulating a relationship between a voltage change $\Delta v$ near a certain direct current operation point Q and a corresponding current change $\Delta i$ in a volt-ampere characteristic curve of the diode, which is represented as follows:

$$\frac{1}{r_d} = \frac{di}{dv} = \frac{d}{dv}\left[I_S\left(e^{\frac{v}{V_T}} - 1\right)\right] = \frac{I_S}{V_T}e^{v/V_T} \approx \frac{i}{V_T}$$

$$r_d = \frac{\Delta v}{\Delta i}\bigg|_Q \approx \frac{V_T}{I_{CQ}}$$

The foregoing formula represents that a value of the small signal alternating-current impedance $r_d$ of the diode is inversely proportional to magnitude of a quiescent current $I_{CQ}$ of the diode. Supposing that an On voltage of the diode Q1 is $V_{th}$, when $V_{ctrl}$ is higher than $V_{th}$, the diode Q1 is on, and the quiescent current $I_{CQ}$ that flows through Q1 and the voltage-drop $V_{on}$ of the diode may be obtained by the following equation:

$$\begin{cases} I_{CQ} = I_S\left(e^{\frac{V_{on}}{V_T}} - 1\right) \\ V_{ctrl} = I_{CQ} \times R_1 + V_{on} \end{cases}$$

Further, after the diode Q1 is on, a small signal impedance presented by the gain adjustment circuit 202 at a working frequency ω point is:

$$Z_{on} = \frac{1}{j\omega C_1} + R_2 + (R_1 // r_{d1})$$

After the diode Q1 is cut off, a small signal impedance presented by the gain adjustment circuit 202 at a working frequency ω point is:

$$Z_{off} = \frac{1}{j\omega C_1} + R_2 + R_1$$

When the gain adjustment circuit is designed, the capacitor C1 of a relatively high capacitance and the resistor R1 of a relatively high resistance are selected, let $$R_1 \gg r_d, R_1 \gg R_2, \frac{1}{j\omega C_1} \ll R_2, \text{ then}$$

$$Z_{on} \approx R_2 + r_d = R_2 + \frac{V_T}{I_{CQ}}$$

$$Z_{off} \approx R_1$$

It can be learned from the above description that when the power amplifier works in the high power mode, $V_{ctrl}$ inputs a low level. If the diode Q1 is intended to present an approximate cut-off state, a resistor R1 of a sufficient high resistance and a capacitor C1 of a relatively high capacitance need to be selected, and a cut-off resistor of the gain adjustment circuit is approximately the resistor R1. When the power amplifier works in the low power mode, $V_{ctrl}$ inputs a high level; the diode Q1 opens and the gain adjustment circuit 202 is on; and a needed low gain may be obtained by adjusting the resistor R2 and $I_{CQ}$.

Embodiment 2

Figure 4:
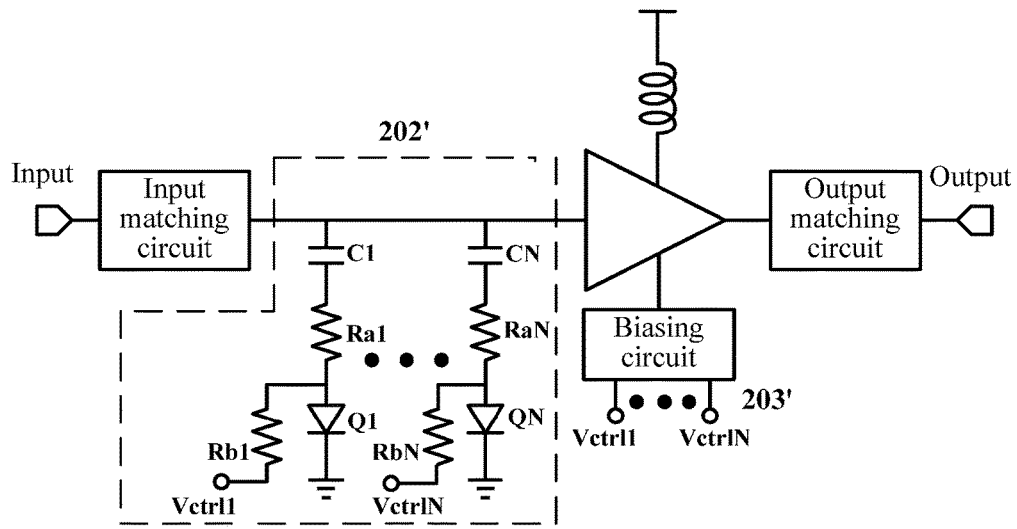
FIG. 4 is a schematic circuit diagram of a gain adjust: circuit according to Embodiment 2 of the present invention.

The power amplifier in Embodiment 1 controls the biasing circuit and the gain adjustment circuit at the same time by using a single gain control voltage Vctrl, so as to implement switching between the high power mode and the low power mode. The power amplifier provided in the embodiment is not merely limited to the switching between the two power modes, but extends to switching of multiple power modes. Referring to FIG. 4, multiple gain adjustment control voltages Vctrl to VctrlN (N is a positive integer, similarly hereinafter) are sequentially configured for a biasing circuit 203', to satisfy an adjustment of a biasing current in multiple power modes. A gain adjustment circuit 202' at an input end of the power amplifier also needs to implement control of multiple power modes. The gain adjustment circuit 202' used in the power amplifier provided in the embodiment includes N independent parallel gain adjustable branches. Each gain adjustable branch includes a capacitor, two resistors, and a diode. Gain adjustment control voltages are independently configured for the gain adjustable branches and separately correspond to the biasing circuit in turn, and are set to Vctrl to VctrlN.

In addition, the present invention further provides a mobile terminal that includes the adjustable gain power amplifier according to Embodiment 1 or Embodiment 2. Communication terminals described herein refer to computer devices of various communications standards that may be used in a mobile environment and support Wireless Fidelity (Wi-Fi), Global System for Mobile Communication (GSM), Enhanced Data rates for GSM Evolution (EDGE), Time Division-Synchronous Code Division Multiple Access (TD_SCDMA), Time Division Duplex Long Term Evolution (TDD_LTE), Frequency Division Duplex-Long Term Evolution (FDD_LTE), including, but not limited to mobile phones, notebook computers, tablet computers, or vehicle-mounted computers. In addition, the adjustable gain power amplifier is also applicable to other occasions to which power amplifiers are applied, such as a communication base station that is compatible with multiple communications standards.

To sum up, the power amplifier provided in the present invention implements switching of multiple power modes only by using an independent radio frequency amplification path. During switching between different power modes, a biasing circuit provides different biasing voltages to a main amplification circuit, and a gain adjustment circuit that controls attenuation is added to a signal input end at the same time, so as to further adjust and optimize a gain of the power amplifier. The power amplifier provided in the present invention is no longer merely limited to an adjustment of the high power mode and the low power mode, so that gain adjustment requirements in a multi-power mode can be satisfied, thus realizing an output of a larger dynamic range. The circuit of the power amplifier has a simple structure and is convenient to integrate. A power switching may be implemented by using the gain adjustment control voltage without a need of a power switching switch, and effects are obvious in the gain adjustment.

An adjustable gain power amplifier, a gain adjustment method, and a mobile terminal that are provided in the present invention are described in detail above. For persons skilled in the art, any obvious variation completed without departing from the spirit disclosed in the present invention shall constitute patent infringement of the present invention and shall bear the corresponding legal responsibility.

What is claimed is:

1. An adjustable gain power amplifier, comprising an input matching circuit, a gain adjustment circuit, a biasing circuit, a main amplification circuit, and an output matching circuit, wherein,
   the input matching circuit is connected between an input end and the gain adjustment circuit;
   the gain adjustment circuit is connected between the input matching circuit and an input end of the main amplification circuit;
   an output end of the main amplification circuit is connected to the output matching circuit; a positive power source end thereof is connected to a power supply source and a negative power source end thereof is connected to the biasing circuit;
   the biasing circuit provides different biasing voltages for the main amplification circuit;
   the gain adjustment circuit and the biasing circuit are respectively connected to a gain adjustment control voltage; and
   the gain adjustment circuit comprises at least one stage of gain adjustment branch;
   the gain adjustment branch comprises a capacitor, resistors, and a diode, wherein
   the capacitor, a second resistor, and the diode are connected in series and grounded; one end of the capacitor is used as an output end, connected between the input matching circuit and the input end of the main amplification circuit; and a connecting point between the second resistor and the diode is connected to the gain adjustment control voltage by using a first resistor.

2. The adjustable gain power amplifier according to claim 1, wherein
   when the gain adjustment circuit comprises multiple stages of gain adjustment branches,
   the gain adjustment branches are connected in parallel; the output end is connected between the input matching circuit and the main amplification circuit.

3. The adjustable gain power amplifier according to claim 2, wherein
   the gain adjustment control voltage is independently configured for each of the gain adjustment branches.

4. The adjustable gain power amplifier according to claim 3, wherein
   the gain adjustment control voltage corresponding to the multiple stages of gain adjustment branches is configured for the biasing circuit.

5. A gain adjustment method for the adjustable gain power amplifier according to claim 1, wherein
   when the power amplifier works in a low frequency mode, the gain adjustment control voltage inputs a high level; the biasing circuit provides a low biasing voltage to the main amplification circuit; and the gain adjustment circuit is on and an input signal of the power amplifier is greatly attenuated;
   when the power amplifier works in a high frequency mode, the gain adjustment control voltage inputs a low level; the biasing circuit provides a high biasing voltage to the main amplification circuit; and the gain adjustment circuit is approximately off and the input signal is slightly attenuated.

6. The gain adjustment method according to claim 5, wherein the gain adjustment circuit satisfies:

$$R_1 \gg r_d,\ R_1 \gg R_2,\ \frac{1}{j\omega C_1} \ll R_2,$$

$$\text{let } Z_{on} \approx R_2 + r_d = R_2 + \frac{V_T}{I_{CQ}},\ Z_{off} \approx R_1, \qquad 5$$

wherein
- $R_1$ is a resistance of the first resistor; $R_2$ is a resistance of the second resistor; $C_1$ is a capacitive reactance of the capacitor; $r_d$ is a small signal alternating-current impedance of the diode; $\omega$ is a working frequency of the gain adjustment circuit; Zon is a small signal impedance of the gain adjustment circuit in the low frequency mode; $Z_{off}$ is a small signal impedance of the gain adjustment circuit in the high frequency mode; $V_T$ is a thermal voltage.

7. The gain adjustment method according to claim 6, wherein
- when the power amplifier works in the low frequency mode, a needed low gain is obtained by adjusting the first resistor and a quiescent current of the diode.

8. A mobile terminal, comprising the adjustable gain power amplifier according to claim 1.

\* \* \* \* \*